(12) United States Patent
Okase et al.

(10) Patent No.: US 6,740,164 B2
(45) Date of Patent: May 25, 2004

(54) PLATING APPARATUS AND METHOD OF MANUFACTURING SEMICONDUCTOR DEVICE

(75) Inventors: Wataru Okase, Tsukui-gun (JP); Takenobu Matsuo, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/058,290

(22) Filed: Jan. 30, 2002

(65) Prior Publication Data
US 2002/0102846 A1 Aug. 1, 2002

(30) Foreign Application Priority Data
Jan. 30, 2001 (JP) ...................... P2001-021619

(51) Int. Cl.[7] .................. H01L 21/44; B05C 13/00; B05C 13/02; B05C 21/00
(52) U.S. Cl. ............. 118/500; 438/678; 438/679; 204/206; 204/224; 204/287; 204/297; 118/403; 118/421; 118/423; 118/429; 118/501
(58) Field of Search ................... 118/500, 501, 118/403, 421, 423, 429; 438/678, 679; 204/15, 28, 206, 224, 297, 287

(56) References Cited
U.S. PATENT DOCUMENTS

| 4,818,349 A | * | 4/1989 | Smith ..................... 204/15 |
| 5,200,048 A | * | 4/1993 | Tanaka et al. ............ 204/297 |
| 6,156,167 A | | 12/2000 | Patton et al. |

* cited by examiner

*Primary Examiner*—David Nelms
*Assistant Examiner*—Renee R. Berry
(74) *Attorney, Agent, or Firm*—Pillsbury Winthrop LLP (57) ABSTRACT

Plating apparatus and plating method that can plate more uniformly on a processing surface of a workpiece are provided. The plating apparatus is comprised of a plating solution bathe which is provided with a first electrode held in a state soaked in a plating solution; a workpiece holding mechanism which holds a workpiece to contact its processing surface to the plating solution; and a contact member, disposed in the workpiece holding mechanism, that electrically contacts with the circumferential edge of the workpiece so to form a conductive layer on the workpiece surface as a second electrode. The contact member is divided along the circumferential direction of the workpiece with which they are electrically contacted. Thus, even if the contact resistance between each section of the contact member with the workpiece is variable, it is possible to adjust the plating electric current for each section of the contact member.

6 Claims, 6 Drawing Sheets

PLATING APPARATUS AND METHOD OF MANUFACTURING SEMICONDUCTOR DEVICE

BACKGROUND OF THE INVENTION

1. Field of the Invention

The present invention relates to a plating apparatus which performs an operation of plating on a processing surface of a workpiece such as a wafer as a device fabrication step and a method of manufacturing a semiconductor device by such a plating apparatus, and more particularly to a plating apparatus suitable for more uniformly plating on a processing surface and a method of manufacturing a semiconductor device.

2. Description of the Related Art

In recent years, a plating step in a semiconductor manufacturing process or a liquid crystal device manufacturing process has come to be used more often than a reaction process which is performed in a vapor phase state as the microfabrication required in manufacturing semiconductor devices or liquid crystal devices is advancing.

In such a plating step, it is significant to ensure the quality of a plated coating and the uniformity of a plated coating thickness on a surface of the workpiece in order to control the quality of semiconductors or the like to be manufactured.

For example, a step of copper plating on a surface of a processing wafer will be described. To plate copper on the processing wafer surface, a conductive seed layer, which makes a cathode for electrolytic plating and also a seed for plating, is previously formed on the pertinent surface.

The processing wafer surface on which the seed layer is formed is soaked in a plating solution bathe so to come into contact with, for example, a copper sulfate based plating solution. And, electrical conductors (cathode contacts which will be simply called contacts) are contacted to the seed layer via an outer periphery of the wafer to supply an electric current for the electrolytic plating. In the plating solution bathe, an anode made of, for example, phosphorus-containing copper is disposed in a state soaked in the plating solution.

Employing the above configuration, an electric current is supplied between the cathode and the anode to make reduction deposition of copper on the cathode which was initially the seed layer, thereby plating copper on the seed layer. When plating, the wafer is mostly spun about its axis in order to form a more uniform plating on the processing surface. Thus, even if a flow of the plating solution in the plating solution bathe is not uniform, it is made averaged, and plating is uniformly made on the surface.

However, this improvement of the plating process for the uniform plating on the surface is helpless against nonuniform plating which results from a contact resistance between the contacts and the wafer. It is a natural consequence because the contact between the circumferential edge of the wafer and the contacts is fixed at certain points and the wafer is spun together with the contacts in the contacted state. Thus, among the contacts which are in contact with the peripheral edge of the wafer, those having a smaller contact resistance have better conductivity with the wafer, but those having a high contact resistance have poor conductivity with the wafer.

Plating is actively carried out and a thick coated layer is formed on portions of the wafer ranging from the contacts contacted with good conductivity to the center of the wafer as compared with portions of the wafer ranging from the contacts contacted with poor conductivity to the center of the wafer. In other words, the processing surface of the wafer is not plated uniformly because of variations in the contact resistance between the contacts and the wafer.

A cause of variations in the contact resistance may be degradation in the contacts themselves. Generally, a wafer holding member structure for sealing with a sealing material is adopted at the contact portions between the circumferential edge of the wafer and the contacts in order to prevent the entry of the plating solution. It is because the plating solution is acid and corrosive.

However, even if sealing is complete, the entry of the plating solution in the form of steam or mist into the contact portions cannot be prevented. Thus, the contacts may be corroded to some extent or the plating material may be defectively deposited on the contacts, resulting is a change in their surfaces. Thereby, variations may be caused in the contact resistance of the contacts.

With the increase in diameter of the wafer in these years, a contact member itself is also becoming large in size, and the number of its contact points is many. It is becoming difficult to provide a constant contact resistance to each of the contact points by uniformly pushing the wafer to such a single contact member.

As described above, the plating apparatus being used now tends to have variations in the contact resistance between the contacts and the wafer and has limitations in uniform plating on the processing surface.

BRIEF SUMMARY OF THE INVENTION

The present invention has been achieved in view of the circumstances described above, and it is an object of the invention to provide a plating apparatus and plating method which can plate more uniformly on a surface of a workpiece.

To achieve the aforementioned object, the plating apparatus according to the present invention has a plating solution bathe which can hold a plating solution and is provided with a first electrode held in a state soaked in the held plating solution; a workpiece holding mechanism which holds a workpiece to contact its processing surface to the plating solution; and a contact member which is disposed in the workpiece holding mechanism and electrically contacted to the circumferential edge of the workpiece so to form a conductive layer on the workpiece surface, which is in contact with the plating solution, as a second electrode; the contact member being divided along the circumferential direction of the workpiece to be electrically contacted.

As the contact member is divided along the circumferential direction of the workpiece, it is possible to adjust an electric current for the plating operation for each section of the contact member even if a contact resistance of the respective sections of the contact member with the workpiece is variable.

Specifically, when the contact member has a relatively high contact resistance, it suffers a voltage drop because of its contact resistance, and the plating electric current lowers accordingly. In such a case, the electric current is increased by raising a voltage applied during the plating operation via the contact member or the electric current for the plating operation via the contact member is directly increased.

Thus, the electric current for the plating operation can be made constant to each contact member, and as a result, the plating is uniformly made on the processing surface.

A method of manufacturing a semiconductor device according to the present invention employs a plating apparatus comprising a plating solution bathe which can hold a plating solution and is provided with a first electrode held in a state soaked in the held plating solution; a workpiece holding mechanism which holds a workpiece to contact its processing surface to the plating solution; and a contact member which is disposed in the workpiece holding mechanism and electrically contacted to the circumferential edge of the workpiece so to form a conductive layer on the workpiece surface, which is in contact with the plating solution, as a second electrode; the contact member being divided along the circumferential direction of the workpiece to be electrically contacted. This method comprises; holding the workpiece by the workpiece holding mechanism, bringing the processing surface of the held workpiece into contact with the plating solution, and plating on the processing surface while controlling the plating electric current passing through each divided section of the contact: member.

According to this method of manufacturing a semiconductor device, it is possible to uniformly plate on the processing surface by the same operation as the aforementioned plating apparatus.

BRIEF DESCRIPTION OF THE DRAWINGS

The present invention will be described with reference to the accompanying drawings, and it is to be understood that such drawings are provided for illustration only and do not limit the present invention in any case.

DETAILED DESCRIPTION OF THE INVENTION (Explanation of Embodiments)

According to the present invention, a contact member is divided along the circumferential direction of a workpiece, and even if a contact resistance between the respective sections of the contact member and the workpiece is variable, it is possible to adjust an electric current for the plating operation to the respective sections of the contact member. Thus, it is possible to provide a constant electric current to each section of the contact member when plating, and as a result, the processing surface is uniformly plated.

A plating apparatus according to an implementation mode is also provided with current control sections which are connected to the respective divided sections of the contact member to control an electric current flowing to the respective sections of the contact member when plating. Specifically, the provision of the current control sections for controlling an electric current flowing to the respective sections of the contact member allows to control directly the electric current to each section of the contact member during the plating operation.

In a plating apparatus according to another implementation mode, the current control sections are provided with a current detecting section which detects an electric current flowing to each section of the contact member during the plating operation and a control current source which adjusts an electric current during the plating operation in such a manner that the detected current has a value substantially equal to a reference value. Thus, each current control section comprises the current detecting section and the control current source.

A plating apparatus according to still another implementation mode is also provided with a reference value setting section which is connected to the current control sections to give the reference value to the current control sections and to set the reference value. In other words, it is configured to make it possible to set the reference value of the plating electric current from the outside.

In a plating apparatus according to still another implementation mode, the contact member is divided into six or more sections along the circumferential direction of the workpiece with which the respective sections of the contact member are electrically contacted. Specifically, as the contact member is divided into the six or more sections, each section comes into electrical contact with the workpiece to serve an area of approximately 60° (($\frac{1}{3}$)π[rad]) or less in the circumferential direction of the workpiece. Thus, even if the workpiece has a diameter of 200 mm, a circumferential length required for the electrical contact of each contact member is slightly more than about 100 mm, which makes it easy to achieve uniform contact in each section of the contact member.

The embodiment of the present invention will be described below with reference to the drawings.

Figure 1:
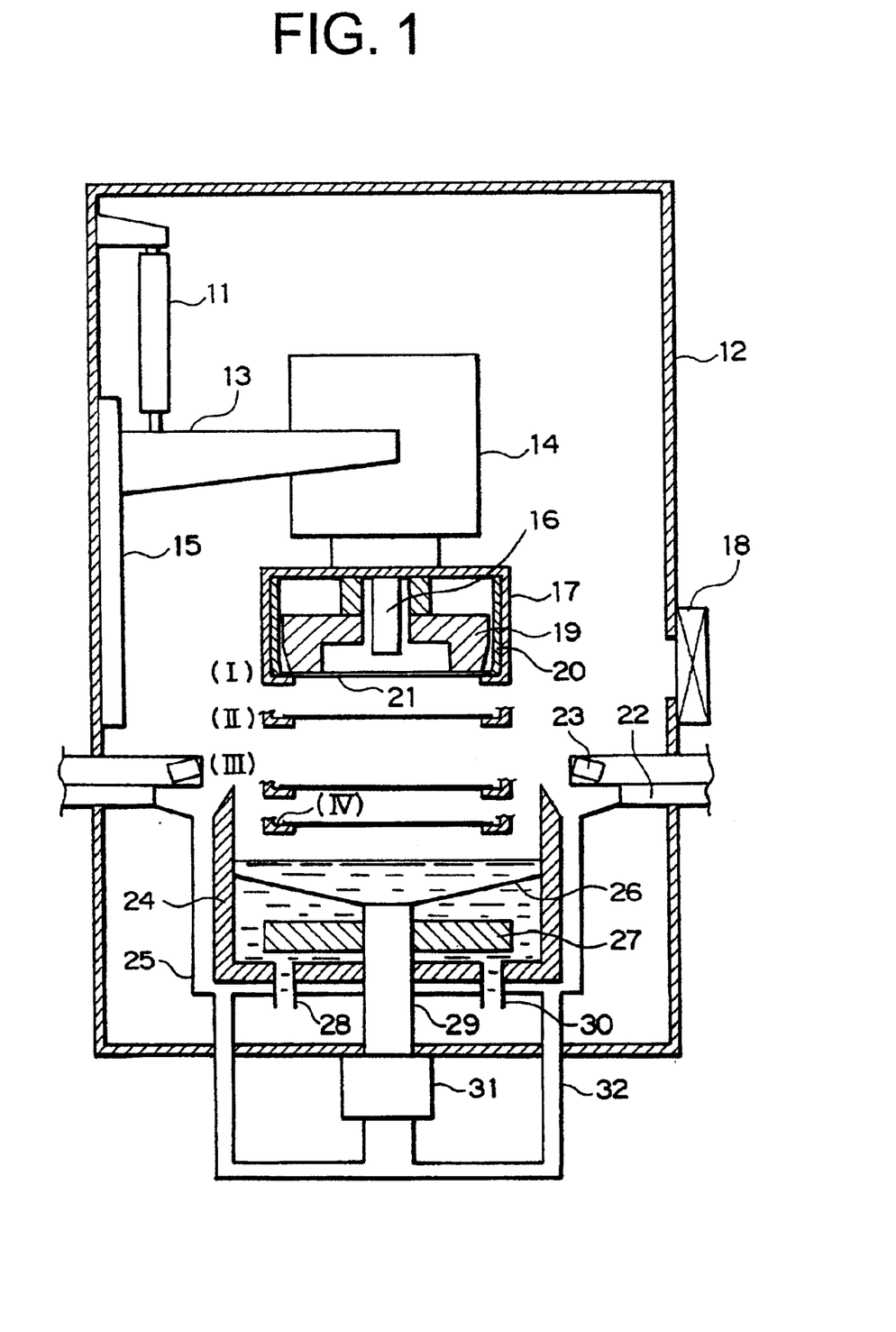
FIG. 1 is a vertical cross sectional view schematically showing a structure of the plating apparatus according to an embodiment of the present invention.

FIG. 1 is a vertical cross sectional view schematically showing a structure of the plating apparatus according to one embodiment of the present invention. As shown in the drawing, this plating apparatus is entirely covered with a housing 12 having an airtight structure. This housing 12 is made of a plating solution-resistant material such as a synthetic resin.

The inside of the housing 12 has a two-storied structure, namely a first processing section located on the lower stage and a second processing section located on the upper stage. The first processing section and the second processing section are separated by a separator which includes washing nozzles 23 and exhaust ports 22 formed below the nozzles 23. A through hole is formed at the center of the separator in such a way that a wafer 21 being held by a wafer holding unit 17 can be traveled between the first processing section and the second processing section. The washing nozzles 23 are disposed in more than one in the circumferential direction of the through hole.

In the housing 12, a gate valve 18, which allows loading/unloading of the wafer 21 into/from the plating apparatus, is disposed a little above the boundary between the first processing section and the second processing section. The interior of the plating apparatus is isolated from the outside space when the gate valve 18 is closed, so that pollution is prevented from diffusing from the plating apparatus to the outside space.

A plating solution bathe 24 is disposed in the first processing section. The plating solution bathe 24 is provided with an outside bathe 25 which is concentrically disposed to accommodate the plating solution bathe 24 in it. The plating solution bathe 24 is fixed in such a manner that when the plating solution bathe 24 is filled with the plating solution, a plating surface of the wafer 21 positioned at a plating position (IV) to be described later is lower than a level of the plating solution.

The plating solution bathe 24 is formed to have an approximately cylindrical shape with a bottom, and an opening of the plating solution bathe 24 is held substantially level. In the plating solution bathe 24, an injection tube 29 which injects the plating solution from the bottom side of the plating solution bathe 24 toward the top is protruded from about the center of the bottom of the plating solution bathe 24 to reach about the middle of the depth of the plating solution bathe 24. A substantially disk-shaped anode 27 is disposed about the injection tube 29 concentrically with the plating solution bathe 24. The anode 27 is dissolved in the plating solution containing, for example, copper sulfate to keep a copper ion concentration constant in the plating solution.

A lead wire is routed from the anode 27 to an unshown external power supply disposed outside of the outside bathe 25. The power supply is turned on to form an electric field between the anode 27 and the wafer 21.

A diaphragm 26 which divides the plating solution bathe 24 into upper and lower sections is disposed above the anode 27 and between the outer edge at the end of the injection tube 29 and the plating solution bathe 24. The plating solution is supplied through the injection tube 29 to the upper portion of the plating solution bathe 24 (hereinafter called "the upper side of the plating solution bathe") which is divided by the diaphragm 26, and the plating solution is supplied through a circulation pipe 28 to be described later to the lower section (hereinafter called the "lower side of the plating solution bathe") of the plating solution bathe 24 which is divided by the diaphragm 26.

The diaphragm 26 is configured to allow permeation of an ion but not to allow permeation of impurities produced when the anode 27 is dissolved and bubbles of, for example, oxygen and hydrogen produced on the plating surface of the wafer 21 during the plating operation. The circulation pipe 28 and a circulation pipe 30 are disposed off the center through the bottom of the plating solution bathe 24. And, an unshown pump is disposed between these circulation pipes 28 and 30. The pump is operated to circulate the plating solution to the lower side of the plating solution bathe 24.

The outside bathe 25 is formed to have a substantially cylindrical shape having a bottom in the same way as the plating solution bathe 24 and its top opening is kept substantially level. Two discharge ports are formed in the bottom of the outside bathe 25, and a pipe 32 is connected to these discharge ports. A pump 31 is disposed between the pipe 32 and the injection tube 29. A tank (not shown) which accommodates the plating solution is connected to the pipe 32 via a pump (not shown) and a valve (not shown), and the unshown pump is operated and the valve is opened to supply the plating solution from the tank to the plating solution bathe 24.

Meanwhile, the wafer holding unit 17 as a workpiece holding mechanism for holding the wafer 21 is disposed just above the center of the plating solution bathe 24. The wafer holding unit 17 is suspended from a motor 14 which rotates the wafer 21 together with the wafer holding unit 17 in a substantially horizontal plane.

The motor 14 is covered with a cover made of a plating solution-resistant material such as a synthetic resin to prevent the entry of a mist resulting from evaporation or spattering of the plating solution into the motor 14.

A beam 13 for supporting the motor 14 is mounted to the exterior of the motor 14. One end of the beam 13 is mounted to the inside wall of the housing 12 via a guide rail 15 so to be movable up and down. The beam 13 is also mounted to the housing 12 via a cylinder 11 which is vertically expandable. This cylinder 11 is driven in such a way that the motor 14 supported by the beam 13 and the wafer holding unit 17 are moved vertically along the guide rail 1.5 to move up or down the wafer 21.

Specifically, the vertical movement is performed in such a way that the wafer 21 held by the wafer holding unit 17 is vertically moved among a loading/unloading position (I) where conveying is started, a washing position (III) where the plating surface of the wafer 21 is washed with, for example, a washing liquid such as pure water, a spin-dry position (III) where spin-drying to be described later is performed, and a plating position (IV) where a plated layer is formed on the plating surface of the wafer 21. The loading/unloading position (I) and the washing position (II) are located above the plating solution level when the plating solution bathe 24 is filled with the plating solution, and the spin-dry position (III) and the plating position (IV) are located beneath the filled plating solution level.

The wafer holding unit 17 is formed to have a substantially cylindrical shape and can hold a single wafer 21 substantially level within the wafer holding unit 17. The wafer holding unit 17 has a substantially round opening formed on its bottom so to make it possible to form a plated layer on the plating surface of the wafer 21 being held within the wafer holding unit 17.

A thin copper film, a so-called seed layer, is previously formed by another device on the plating surface of the wafer 21 which is held by the wafer holding unit 17, and a voltage which is applied to a cathode contact member to be described later is also applied to the plating surface of the wafer 21.

The wafer holding unit 17 is provided with a wafer pushing mechanism 19 and a contact/seal presser 20. The back side of the wafer 21 placed on the wafer holding unit 17 is pushed by the wafer pushing mechanism 19 to insure an electrical contact between the wafer 21 and the contact. The wafer pushing mechanism 19 is disposed to be able to push uniformly the outer edge of the wafer 21 in the circumferential direction and configured to vertically move independent of the wafer holding unit 17.

The contact/seal presser 20 is to push and hold the cathode contact member and a sealing member to be described later against the wafer holding unit 17. The contact/seal presser 20 is disposed in such a way to agree with the circumferential direction of the wafer holding unit; 17.

Besides, a vacuum chuck 16 is installed at the center of the wafer holding unit 17 and can move the wafer 21 upward from the bottom of the wafer holding unit 17 when the contacts are washed. The vacuum chuck 16 is configured to be movable vertically independent of the wafer holding unit 17.

The sealing member to be described later is fitted to an edge of the inside opening of the wafer holding unit 17, and the plating solution can be prevented from entering the inside by the sealing member and the aforementioned pushing pressure.

Figure 2:
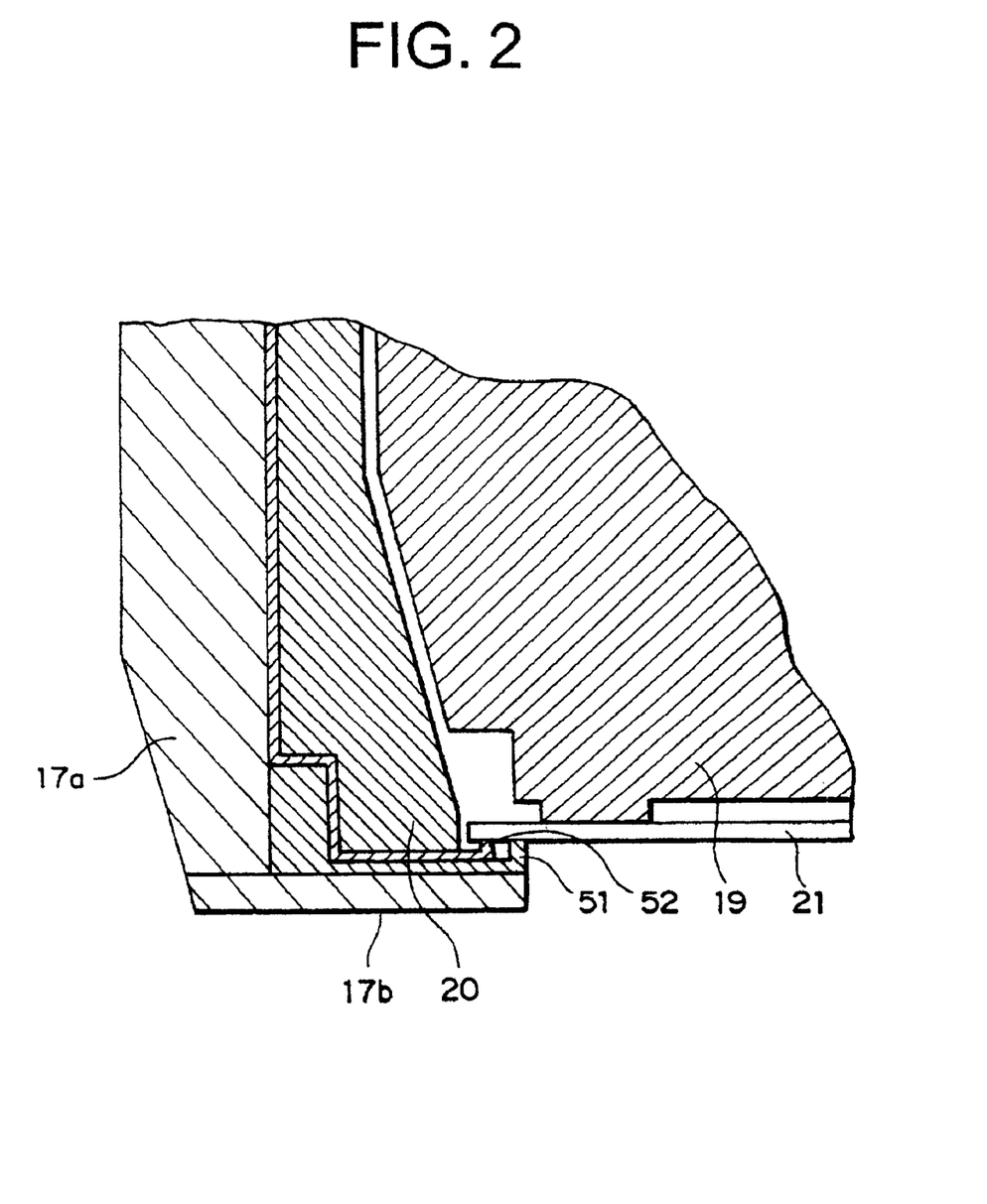
FIG. 2 is a vertical cross sectional view schematically illustrating a mounted state of a wafer 21 on a wafer holding unit 17 shown in FIG. 1.

Then, the state of the wafer 21 placed in the wafer holding unit 17 of the plating apparatus of this embodiment will be described in detail with reference to FIG. 2. FIG. 2 is a schematic vertical cross sectional view for illustrating the state of the wafer 21 placed in the wafer holding unit 17. In the drawing, like reference numerals are used to indicate the like component members already described.

As shown in FIG. 2, the wafer holding unit 17 is comprised of a side member 17a and a bottom member 17b, and a cathode contact member 52 is disposed within them to apply a voltage to the plating surface of the wafer 21. The cathode contact member 52 is made of a conductive material and comprised of sections, which are divided in the circumferential direction of the wafer holding unit: 17 and formed to have a ring shape as the whole, and a contact point which is protruded from the divided sections.

At least one contact point is formed to be integral with each section of the divided ring shape. And, the number go of contact points in the circumferential direction of the wafer is preferably 6 to 180. It is because when the wafer 21 has a diameter of, for example, 30 cm and the number of contact points is more than 180, defective processing tends to be caused in manufacturing. And, if it is smaller than the aforementioned range, a plating electric current is hardly distributed uniformly on the plating surface of the wafer 21.

And, a lead wire is connected to each section of the cathode contact member 52 in such a way that a voltage can be applied from an unshown external power supply through the lead wire. Thus, an electric current to the respective sections of the cathode contact member 52 can be controlled.

Contact portions of the wafer 21 with the contact member 52 are sealed by a sealing member 51 to prevent the plating solution from entering. The sealing member 51 is disposed in the shape of a ring in the circumferential direction of the wafer holding unit 17 and protruded in the shape of a ring in a direction to face the wafer 21. And the sealing member 51 is made of an elastic material such as rubber and elastically deformed to insure a sealing property with the plating surface of the wafer 21 when the back side of the wafer 21 is pushed downward by the wafer pushing mechanism 19.

Regardless of the sealing property insured, a trace quantity of the plating solution tends to reach the contact member 52 as described above.

Figure 3:
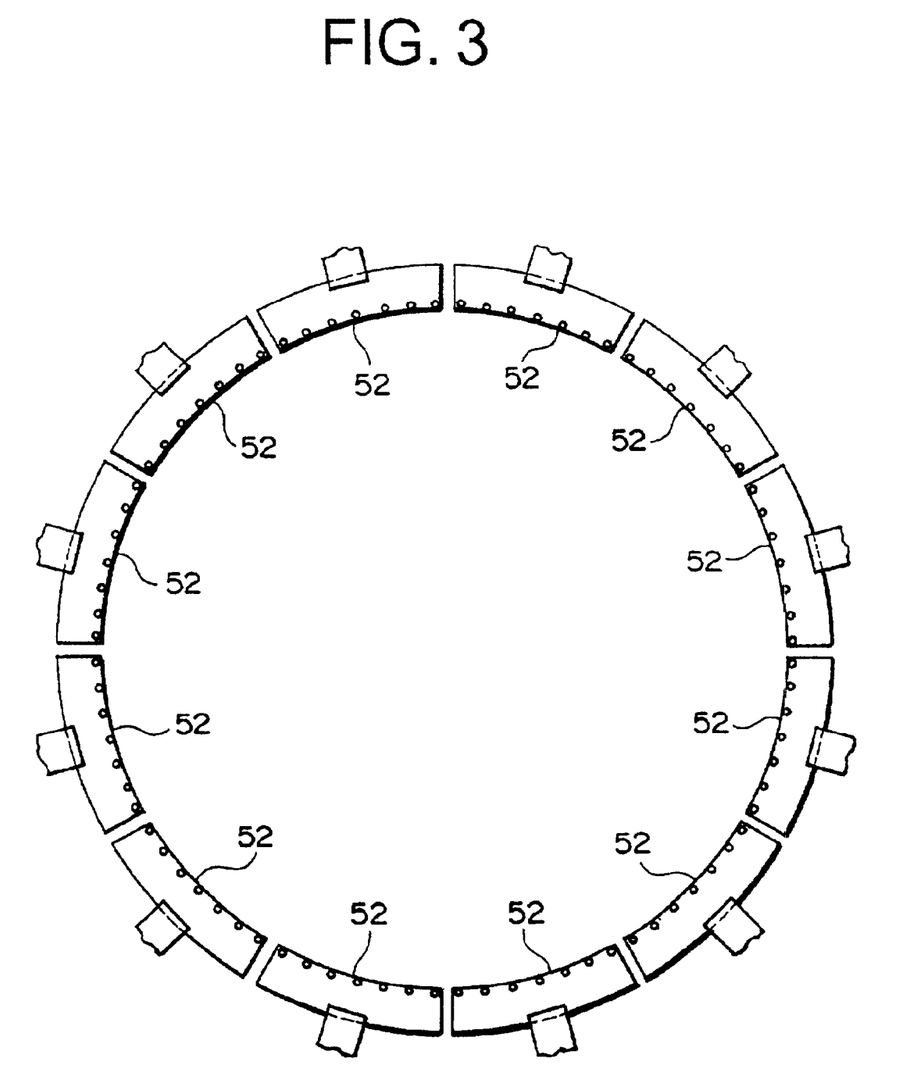
FIG. 3 is a top view showing a structure of a contact member 52 shown in FIG. 2.

Then, the structure of the contact member 52 of the plating apparatus according to this embodiment will be further described with reference to FIG. 3. FIG. 3 is a top view showing the structure of the contact member 52.

As shown in FIG. 3, the contact member 52 is divided and formed in the shape of a ring as the whole. It is divided into 12 sections in this embodiment. A plating electric current to each divided section of the contact member 52 is controlled so to be supplied uniformly. Thus, when the number of divided sections of the contact member increases, the plating electric current to each portion of the wafer can be made constant very carefully, but a scale of the electric current control sections becomes large.

Conversely, when the number of divided sections of the contact member is decreased, the control of the plating electric current to each portion of the wafer becomes rough, and a length of each contact member 52 in the circumferential direction of the wafer becomes long, and as a result, it becomes difficult to make the contact resistance of each contact point in the divided sections of the contact member 52 constant. Therefore, it is necessary to have the number of divided sections of the contact member in a predetermined value or more in order to achieve the object of the present invention to uniformly plate on the wafer.

For example, when it is assumed that the wafer has a diameter of 200 mm and the number of division is six, each contact member 52 has a relatively short length of a little over 100 mm in the circumferential direction of the wafer and an almost linear shape. Therefore, it is easy to provide a uniform pressure for contacting at each contact point. Thus, an appropriate number of division can be determined taking the number of contact points in each section of the contact member 52 and the diameter of the wafer into consideration. At this time, a scale of the electric current control sections may also be taken into account in view of economy and efficiency.

Figure 4:
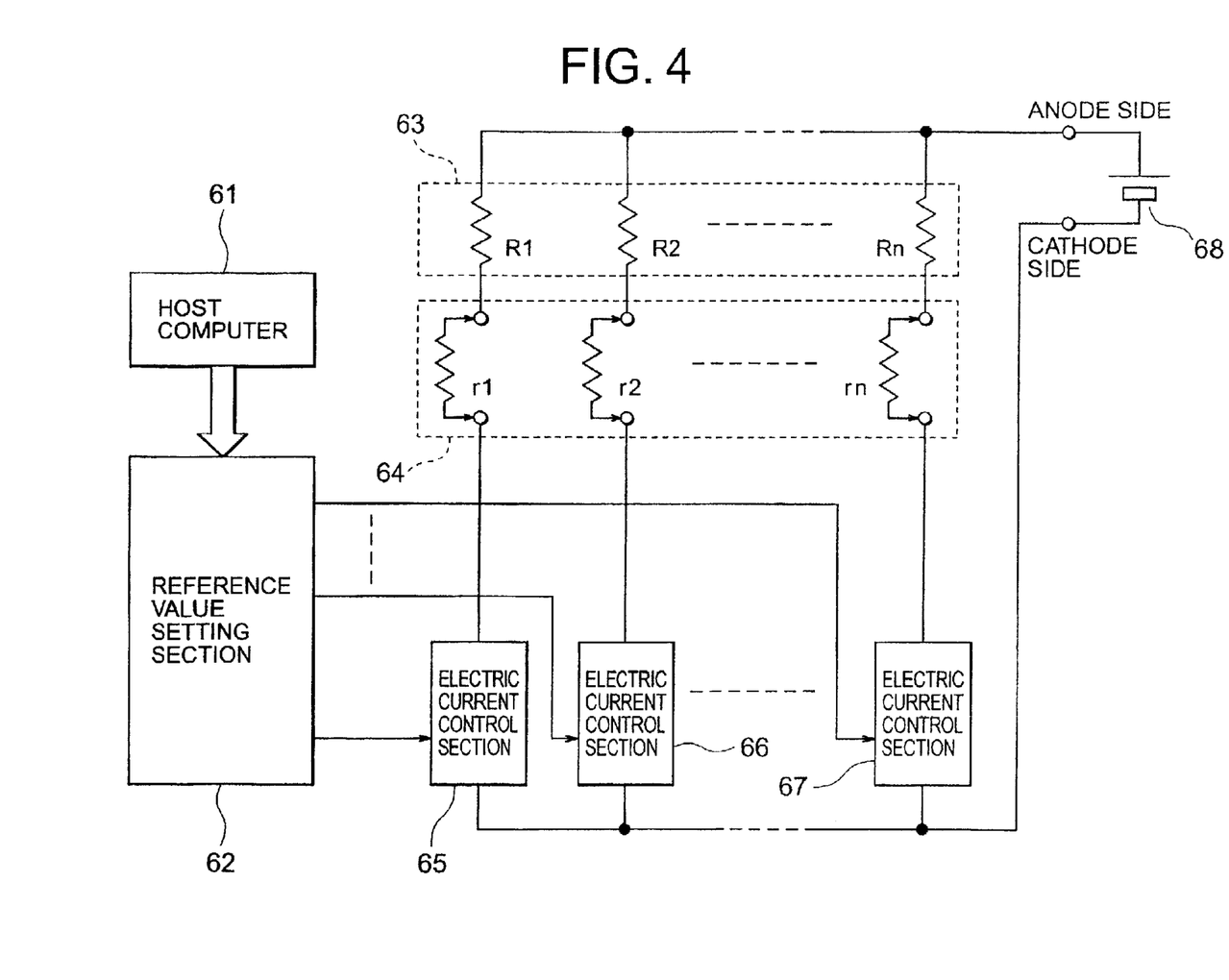
FIG. 4 is a structure diagram showing an electrical system for a plating operation, including electric current control sections in the plating apparatus according to an embodiment of the present invention.

Then, the electric current control sections to be applied to the plating apparatus of this embodiment will be described with reference to FIG. 4. FIG. 4 is a structure diagram showing the electrical system for the plating operation including the electric current control sections.

As shown in FIG. 4, the anode side of a plating power supply 68 is applied to an equivalent resistance 6.3 of the plating solution via the anode of the plating solution bathe. The equivalent resistance 63 of the plating solution consists of virtual resistance R1, R2, . . . , Rn, which are electrically connected to the respective sections of the cathode contact member 52, according to the division of the cathode contact member 52 into more than one. In FIG. 4, it can be assumed that the equivalent resistance 63 in the plating solution includes an electrical resistance of the wafer surface.

The cathode contact member 52 and the wafer 21 are electrically connected owing to contact resistance r1, r2, . . . , rn as they are contacted. Such contact resistance r1, r2, . . . , rn are collectively indicated by reference numeral 64.

The lead wires extended from the respective sections of the cathode contact member are connected to the electric current control sections 65, 66, . . . , 67 which control to pass a constant current value through them. In other words, the electric current control sections 65, 66, . . . , 67 can most simply use a constant-current supply having a predetermined current value. Thus, regardless of variations in the contact resistance r1, r2, . . . , rn, the electric current passing through each section of the contact; member can be made constant, and consequently, the plating surface of the wafer can be plated uniformly.

In the example structure shown in FIG. 4, it is configured to send the reference value from the reference value setting section 62 to the respective electric current control sections 65, 66, . . . , 67. According to the transmitted reference value, the respective electric current control sections 65, 66, . . . , 67 are driven to pass an electric current according to the reference value. Specifically, the respective electric current control sections 65, 66, . . . , 67 serve as voltage control current sources or current control current sources. The reference value may be transmitted not depending on analog information such as an electric current or a voltage but depending on digital information. By virtue of the configuration to send the reference value, it may be controlled in such a way that the plating operation is performed by previously providing a predetermined electric current value, and the current value can be controlled in a time direction during the plating operation.

The reference value setting section 62 is connected Aid to a host computer 61. Thus, the operation of the reference value setting section 62 can be controlled as part of the control performed by the host computer 61.

Figure 5:
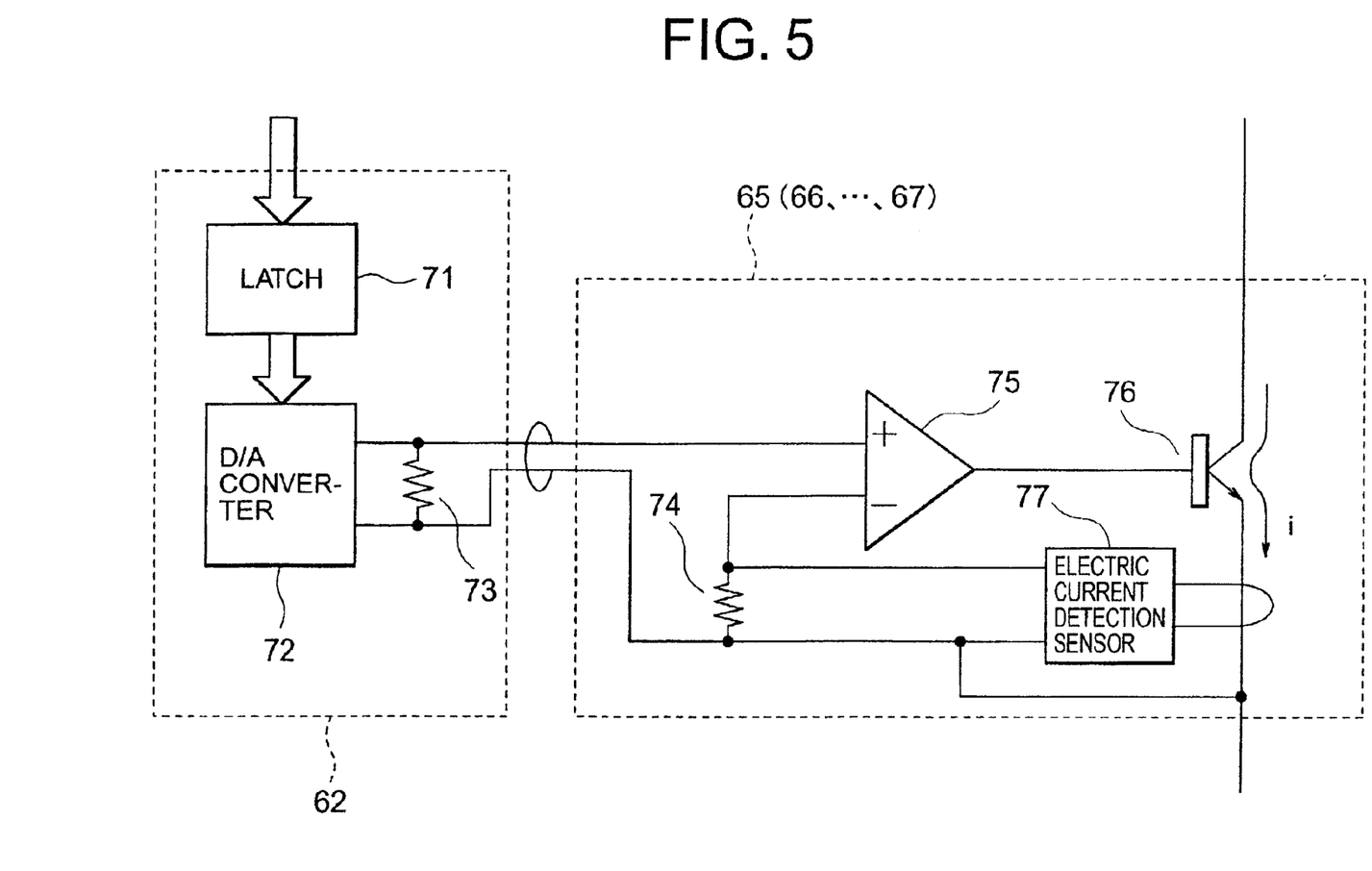
FIG. 5 is a structure diagram showing a specific example structure of current control sections 65, 66 . . . , 67 and a reference value setting section 62 shown in FIG. 4.

Then, the structures of the aforementioned electric current control sections 65, 66, . . . , 67 and the reference value setting section 62 will be described specifically with reference to FIG. 5. FIG. 5 is a structure diagram showing a specific example structure of the aforementioned electric current control sections 65, 66, . . . , 67 and the reference value setting section 62.

As shown in FIG. 5, the electric current control section 65 (66, . . . , 67) has a transistor 76 as a controlled current source, an electric current detection sensor 77 as an electric current detector for detecting a collector-to-emitter electric current i of the transistor 76, an output resistor 74 of the electric current detection sensor 77, and an operational amplifier 75 inputted from output of the electric current detection sensor 77 and the reference value from the reference value setting section 62 as two inputs.

And, the reference value setting section 62 has a latch 71, a D/A converter 72 and an output resistor 73 of the D/A converter 72. The latch 71 receives and holds digital information which is to be the reference according to control from the host computer 61. The D/A converter 72 converts the digital value which is held by the latch 71 into an analog value and sends it to the electric current control section 65 (66, . . . , 67) via the output resistor 73.

A group of the latch 71, the D/A converter 72 and the output resistor 73 in the reference value setting section 62 can be provided in a multiple quantity depending on the electric current control section 65 (66, . . . , 67) of a target to which the reference value is sent, and the electric current control sections 65, 66, . . . , 67 of the target to which the reference value is sent may be collectively dealt with by a single group of the latch 71, the D/A converter 72 and the output resistor 73. When a plurality of groups are provided in association with the current control section 65 (66, . . . , 67) of the target to which the reference value is sent, the reference value can be sent to each of the electric current control sections 65, 66, . . . , 67 in such a way that variations in input offset possessed by the operational amplifier 75 and detection sensitivity possessed by the electric current detection sensor 77 are canceled.

The electric current detection sensor 77 detects the collector-to-emitter electric current i of the transistor 76 on its emitter side. The electric current detection sensor 77 can be, for example, a hall element type current sensor. The collector-to-emitter current i may be detected on the collector side.

Voltage output of the electric current detection sensor 77 is added to the negative input side of the operational amplifier 75 via the output resistor 74 and then operationally amplified with the reference value added to the positive input side of the operational amplifier 75. Therefore, an output voltage of the operational amplifier 75 is outputted in such a way that the voltage output of the electric current detection sensor 77 and the input reference value become equal (to become so-called imaginary short). At this time, the output of the operational amplifier 75 is fed back to the negative input side of the operational amplifier 75 via the base, the emitter of the transistor 76 and the electric current detection sensor 77 depending on a magnitude of the output. Thus, the collector-to-emitter current i is controlled according to the input reference value.

In an actual design, the electric current detection sensor 77 might have a low detection sensitivity of about 0.1 V/A. In such a case, the output of the electric current detection sensor 77 may be DC amplified and lead to the negative side of the operational amplifier 75. Thus, it is easy to have the same magnitude with the full-scale value of the output of the D/A converter 72. Instead of the DC amplification of the output of the electric current detection sensor 77, a voltage produced in the output resistor 73 of the D/A converter 72 may be divided, and the divided voltage may be lead to the positive side of the operational amplifier 75. Thus, the two inputs to the D/A converter 72 can be made to have the same magnitude.

Figure 6:
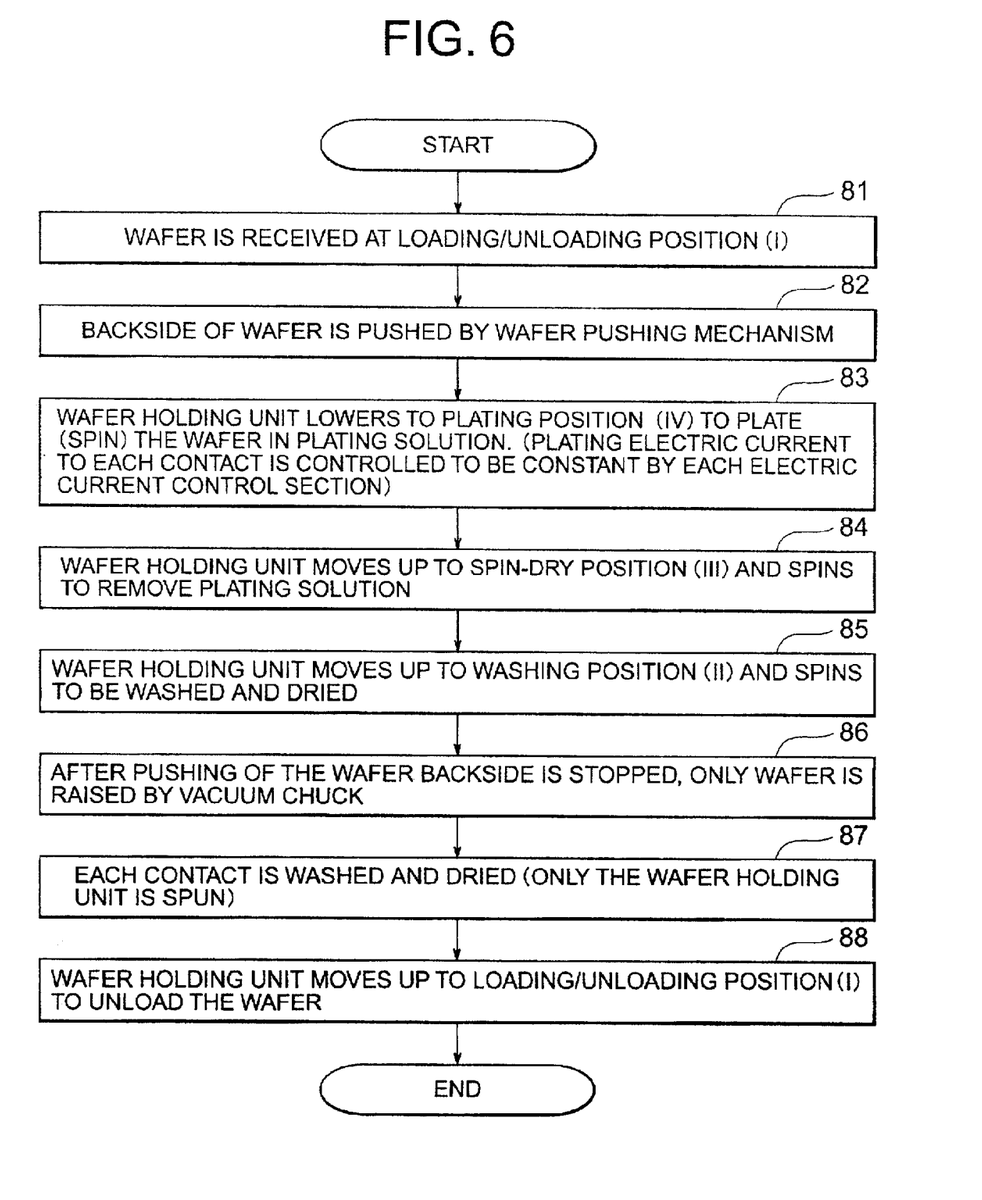
FIG. 6 is a flow chart showing a flow of an, operation of the plating apparatus according to the embodiment of the present invention.

Then, the operation of the plating apparatus, which has the structure described above, according to this embodiment of the invention will be described with reference to FIG. 6. FIG. 6 is a flow chart showing a flow of the operation of the plating apparatus according to this embodiment of the invention.

First, the gate valve 18 which is mounted on the side wall of the plating apparatus opens, an arm carrying an untreated wafer extends to place the wafer substantially level in the wafer holding unit 17, which is in position at the wafer loading/unloading position (I), with the plating surface of the wafer 21 faced the surface of the plating solution containing, for example, copper sulfate. Specifically, the wafer holding unit 17 receives the wafer 21 in such a way that the wafer 21 is placed on the contact points of the divided sections of the contact member 52 as shown in FIG. 2 (step 81).

After placing the wafer 21 on the contact member 52, the arm retracts, the gate valve 18 closes, and then the back side of the wafer 21 is pushed by the wafer pushing mechanism 19 which is provided in the wafer holding unit 17 (step 82). At this time, the plating solution bathe 24 is filled with the plating solution. Thus, the projection of the sealing member 51 is pushed to elastically deform and to produce a compressive stress so to repel the contacted wafer 21, thereby preventing the entry of the plating solution into the wafer holding unit 17.

Then, while keeping the sealed state, the wafer holding unit 17 is lowered by the cylinder 11 to place the wafer 21 at the plating position (IV), and a voltage is applied between the anode 27 and the cathode contact member 52 to plate, for example, copper on the plating surface of the wafer 21 (step 83). In the plating operation, the wafer holding unit 17 rotates to remedy nonuniform processing of the wafer 21 which results from a flow of the plating solution.

During the plating operation, an electric current for the plating operation is controlled to be constant for the respective sections of the contact member 52 by the respective current control sections 65, 66, . . . , 67. Thus, a nonuniform plating operation resulting from the contact resistance between the wafer 21 and the contact member 52 is also remedied.

After forming a plated layer having a sufficient thickness on the plating surface of the wafer 21, the application of a voltage is stopped. And, a predetermined amount of the plating solution is sent back to the unshown tank to lower the plating solution level in the plating solution bathe 24. After lowering the plating solution level, the wafer holding unit 17 is raised by the cylinder 11 to place the wafer 21 at the spin-dry position (III).

In this state, the wafer holding unit 17 is spun in a substantially horizontal plane by the motor 14 to perform spin-drying so to remove an excessive plating solution adhered to the plating surface of the wafer 21 (step 84).

After performing the spin-drying thoroughly, the cylinder 11 is driven to move up the wafer holding unit 17 so to place the wafer 21 at the washing position (II). In this state, the motor 14 is driven to spin the wafer holding unit 17 in a substantially horizontal plane, and pure water is also injected from the washing nozzles 23 built in the separator to the plated layer-formed surface of the wafer 21 to wash the plated layer-formed surface of the wafer 21 and to dry it (step 85).

After the plated layer-formed surface of the wafer 21 is dried, the wafer holding unit 17 is held as it is, and the pushing by the wafer pushing mechanism 19 is stopped. And, the vacuum chuck 16 for vertically moving the wafer 21 attracts the back of the wafer 21 to pull it up (step 86).

With the wafer 21 in the raised state, only the wafer holding unit 17 is spun by the motor 14, the washing liquid, e.g., pure water is injected from the washing nozzle 23 built in the separator to the contact member 52 for washing, and the contact member 52 are dried by being spun (step 87).

(The wafer 21 may also be spun for drying by spinning the vacuum chuck 16 together with the wafer holding unit 17.)

Then, the wafer holding unit 17 is raised by the cylinder 11 to place the wafer 21 at the loading/unloading position (I), the wafer 21 being unloaded (step 88).

It may be configured in such a way that the wafer holding unit 17 is lowered to position at the spin-dry position (III) between step 87 and step 88, and the vacuum chuck 16 is spun together with the wafer holding unit 17 to make spin-drying of the wafer 21. At this time, air may be blown to the contact member 52 by an unshown air supply apparatus so as to remove the water sufficiently.

As described above, the contact member 52 is divided in the circumferential direction of the wafer according to this embodiment, and an electric current to each divided section of the contact member is controlled to be constant during the plating operation. Therefore, even if the plating solution or the washing liquid adheres to the surface of the contact member 52 or is changed in quality causing a change in the contact resistance, the plating electric current can be kept constant regardless of the contact portions of the contact member 52.

Besides, the contact member 52 itself is made-compact because it is divided into sections, and the number of contact points formed thereon is decreased, so that the contact points can be contacted more uniformly. Therefore, the plating can be made uniformly in the respective portions of the wafer which are respectively contacted with the divided contact member 52.

Thus, the plating surface of the wafer 21 can be plated more uniformly.

It is to be understood that the present invention is not limited to the particular embodiments described with reference to the drawings but all modifications that fall within the accompanying claims can be made without departing from the true spirit and scope of the invention.

What is claimed is:

1. A plating apparatus, comprising:

a plating solution bathe which can hold a plating solution and is provided with a first electrode held in a state soaked in the held plating solution;

a workpiece holding mechanism which can hold a workpiece to contact its processing surface to the plating solution; and a contact member, disposed in the workpiece holding mechanism, that can electrically contact with the circumferential edge of the workpiece so to form a conductive layer on the workpiece surface, which is in contact with the plating solution, as a second electrode;

wherein the contact member is divided along the circumferential direction of the workpiece to be electrically contacted.

2. The plating apparatus according to claim 1, further comprising electric current control sections which are connected to the respective divided sections of the contact member to control a plating electric current passing through the respective sections of the contact member.

3. The plating apparatus according to claim 2, wherein the electric current control sections are provided with an electric current detecting section that detects a plating electric current passing through the respective sections of the contact member and a controlled current source that adjusts the plating electric current in such a way that a value of the detected electric current becomes substantially equal to a reference value.

4. The plating apparatus according to claim 2, further comprising a reference value setting section, connected to the electric current control sections in order to give a reference value to the electric current control sections, that sets the reference value.

5. The plating apparatus according to claim 3, further comprising a reference value setting section, connected to the electric current control sections in order to give the reference value to the electric current control sections, that sets the reference value.

6. The plating apparatus according to claim 1, wherein the contact member is divided into six or more sections along the circumferential direction of the workpiece to be electrically contacted.

\* \* \* \* \*